United States Patent
Schubert et al.

(10) Patent No.: US 11,908,978 B2
(45) Date of Patent: *Feb. 20, 2024

(54) SOLID-STATE TRANSDUCER DEVICES WITH SELECTIVE WAVELENGTH REFLECTORS AND ASSOCIATED SYSTEMS AND METHODS

(71) Applicant: Micron Technology, Inc., Boise, ID (US)

(72) Inventors: Martin F. Schubert, Mountain View, CA (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 576 days.

This patent is subject to a terminal disclaimer.

(21) Appl. No.: 17/113,586

(22) Filed: Dec. 7, 2020

(65) Prior Publication Data
US 2021/0119089 A1 Apr. 22, 2021

Related U.S. Application Data

(63) Continuation of application No. 13/474,658, filed on May 17, 2012, now Pat. No. 10,879,428.

(51) Int. Cl.
*H01L 33/50* (2010.01)
*H01L 33/46* (2010.01)
*H01L 33/32* (2010.01)

(52) U.S. Cl.
CPC .............. *H01L 33/50* (2013.01); *H01L 33/46* (2013.01); *H01L 33/32* (2013.01)

(58) Field of Classification Search
CPC . H01L 3/32; H01L 33/50; H01L 33/46; H01L 33/08
See application file for complete search history.

(56) References Cited

U.S. PATENT DOCUMENTS

| | | | |
|---|---|---|---|
| 7,091,653 | B2 | 8/2006 | Adachi et al. |
| 7,540,616 | B2 | 6/2009 | Conner |
| 8,002,428 | B2 | 8/2011 | Boyer et al. |
| 8,042,968 | B2 | 10/2011 | Boyer et al. |
| 8,075,148 | B2 | 12/2011 | Nada |
| 2002/0093284 | A1 | 7/2002 | Adachi et al. |
| 2004/0145913 | A1 | 7/2004 | Ouderkirk et al. |
| 2006/0284170 | A1 | 12/2006 | Leo et al. |
| 2009/0147497 | A1 | 6/2009 | Nada et al. |

(Continued)

FOREIGN PATENT DOCUMENTS

JP 2007142268 A 6/2007

*Primary Examiner* — Savitri Mulpuri
(74) *Attorney, Agent, or Firm* — Perkins Coie LLP

(57) ABSTRACT

Solid state transducer ("SST") devices with selective wavelength reflectors and associated systems and methods are disclosed herein. In several embodiments, for example, an SST device can include a first emitter configured to emit emissions having a first wavelength and a second emitter configured to emit emissions having a second wavelength different from the first wavelength. The first and second emitters can be SST structures and/or converter materials. The SST device can further include a selective wavelength reflector between the first and second emitters. The selective wavelength reflector can be configured to at least substantially transmit emissions having the first wavelength and at least substantially reflect emissions having the second wavelength.

17 Claims, 5 Drawing Sheets

(56) References Cited

U.S. PATENT DOCUMENTS

2011/0073898 A1    3/2011   Diederich et al.
2012/0228653 A1    9/2012   Ishida et al.
2013/0308309 A1   11/2013   Schubert et al.

ial 26 to travel inwardly toward the LED structure 12. These# SOLID-STATE TRANSDUCER DEVICES WITH SELECTIVE WAVELENGTH REFLECTORS AND ASSOCIATED SYSTEMS AND METHODS

CROSS-REFERENCE TO RELATED APPLICATION

This application is a continuation of U.S. patent application Ser. No. 13/474,658, filed May 16, 2012, which is incorporated herein by reference in its entirety.

TECHNICAL FIELD

The disclosed embodiments relate to solid-state transducer ("SST") devices and methods of manufacturing SST devices. In particular, the present technology relates to SST devices with selective wavelength reflectors and associated systems and methods.

BACKGROUND

Mobile phones, personal digital assistants ("PDAs"), digital cameras, MP3 players, and other portable electronic devices utilize light-emitting diodes ("LEDs"), organic light-emitting diodes ("OLEDs"), polymer light-emitting diodes ("PLEDs"), and other SST devices for backlighting. SST devices are also used for signage, indoor lighting, outdoor lighting, and other types of general illumination. FIG. 1A, for example, is a partially schematic cross-sectional view of a conventional SST device 10*a*. The SST device 10*a* includes a carrier substrate 20 supporting an LED structure 12 that has an active region 14 (e.g., containing gallium nitride/indium gallium nitride (GaN/InGaN) multiple quantum wells ("MQWs")) between N-type gallium nitride ("N-GaN") 16 and P-type gallium nitride ("P-GaN") 18. A first contact 22 is on the P-type GaN 18 and a second contact 24 is on the N-GaN 16 such that the first and second contacts 22 and 24 are configured in a vertical arrangement on opposite sides of the LED structure 12. In other embodiments, the N-GaN 16 and the active region 14 may be recessed to expose the P-GaN 18, and the first and second contacts 22 and 24 can be spaced laterally apart from one another on forward-facing surfaces or backward-facing surfaces of the N-GaN 16 and the P-GaN. Electrical power can be provided to the SST device 10*a* via the contacts 22, 24, causing the active region 14 to emit light.

The SST device 10*a* can be configured as a "white light" LED, which requires a mixture of wavelengths to be perceived as white by human eyes. LED structures typically only emit light at one particular wavelength (e.g., blue light), and are therefore modified to generate white light. One conventional technique for modulating the light from LED structures includes depositing a converter material (e.g., phosphor) on the LED structure. For example, as shown in FIG. 1A, a conformal converter material 26 can be formed on the front surface of the LED structure 12. In other conventional SST devices, the converter material 26 can be spaced apart from the LED structure 12. FIG. 1B, for example, illustrates a conventional SST device 10*b* having such a remote converter material 26, which is supported by a larger support substrate 21 underlying the LED structure 12. Both the SST devices 10*a-b* shown in FIGS. 1A and 1B can include optical features, such as encapsulants or lenses 28, that are formed or otherwise positioned over the LED structure 12 and/or the converter material 26 to modulate the emissions.

In operation, the LED structure 12 emits light having a certain wavelength (e.g., blue light), and the overlying converter material 26 absorbs some of the emissions generated by the LED structure 12 and reemits light having a longer wavelength (e.g., yellow light). The combination of the emissions from the LED structure 12 and the converter material 26 can be designed to appear white to human eyes when the wavelengths of the emissions are matched appropriately. However, the converter material 26 emits light isotropically, and therefore causes at least a portion of the converter emissions (e.g., about half of the converter emissions) to travel inwardly toward the LED structure 12. These inward converter emissions reflect off the face of the LED structure 12 and/or the underlying substrates 20 and 21 multiple times (e.g., as indicated by the arrows shown in FIG. 1B) before being extracted from the SST devices 10*a-b* as useful light. The emissions of the SST devices 10*a-b* dissipate with each reflection since the LED structure 12 and the surrounding components are generally sub-optimal or imperfect reflectors due to other operational considerations, such as current spreading, light-extraction efficiency, and electrical characteristics. Accordingly, the inward propagation of light and the resultant reflections impact the light extraction efficiency of the SST devices 10*a-b*.

DETAILED DESCRIPTION

Specific details of several embodiments of SST devices with selective wavelength reflectors and associated systems and methods are described below. The term "SST device" generally refers to solid-state devices that include a semiconductor material as the active medium to convert electrical energy into electromagnetic radiation in the visible, ultraviolet, infrared, and/or other spectra. For example, SST devices include solid-state light emitters (e.g., LEDs, laser diodes, etc.) and/or other sources of emission other than electrical filaments, plasmas, or gases. SST devices can also include solid-state devices that convert electromagnetic radiation into electricity. A person skilled in the relevant art will also understand that the technology may have additional embodiments, and that the technology may be practiced without several of the details of the embodiments described below with reference to FIGS. 2A-6.

Figure 2A:
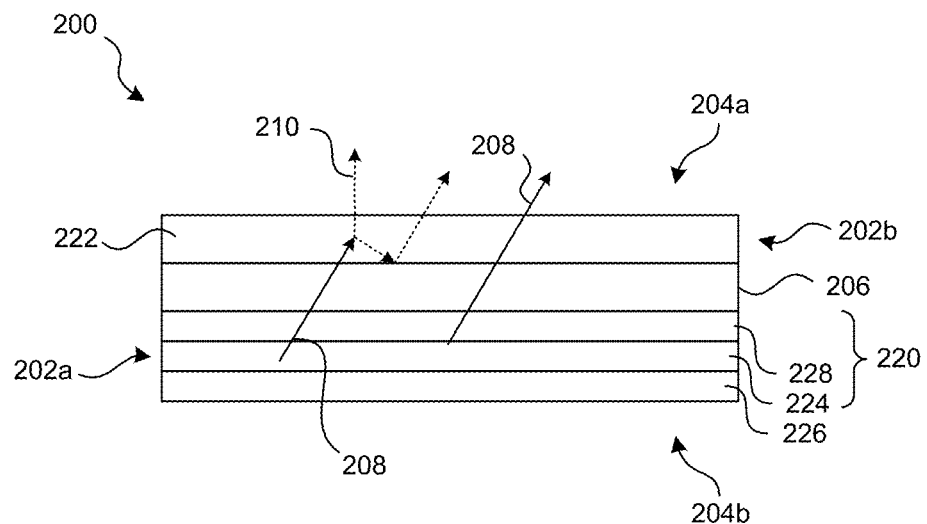
FIG. 2A is a cross-sectional view an SST device configured in accordance with embodiments of the present technology.

FIG. 2A is a cross-sectional view of an SST device 200 configured in accordance with embodiments of the present technology. The SST device 200 has a front side 204a from which emissions exit the SST device 200 and a back side 204b facing away from the front side 204a. As shown in FIG. 2A, the SST device 200 can include a first emitter 202a proximate the back side 204b of the SST device 200, a second emitter 202b proximate the front side 204a, and a selective wavelength reflector 206 between the first and second emitters 202a and 202b. The first emitter 202a can be configured to generate emissions (e.g., light) having a first wavelength (e.g., shown as first arrows 208 with solid lines), and the second emitter 202b can be configured to actively or passively produce emissions having a second wavelength different from the first wavelength (e.g., shown as second arrows 210 with dotted lines). The selective wavelength reflector 206 can be configured to at least substantially transmit the emissions from the first emitter 202a (i.e., toward the front side 204a of the SST device 200) and at least substantially reflect emissions having other selected wavelengths. For example, as indicated by the second arrows 210 shown in FIG. 2A, the selective wavelength reflector 206 can be configured such that inwardly-directed emissions from the second emitter 202b (e.g., caused by isotropic emissions of a converter material) are at least substantially reflected or otherwise diverted toward the front side 204a such that they can exit the SST device 200. Accordingly, the selective wavelength reflector 206 inhibits the emissions from the second emitter 202b from reflecting off a sub-optimal reflector on the face of the first emitter 202a, and does so without substantially interfering with the transmission of the emissions of the first emitter 202a toward the front side 204a.

In the embodiment illustrated in FIG. 2A, the first emitter 202a is an SST structure 220 (e.g., an electrically-driven light source), and the second emitter 202b is a converter material 222 (e.g., a photonically driven or heat driven light source) which can absorb emissions generated by the SST structure to passively reemit emissions having a different wavelength. For example, the SST structure 220 can be configured to emit blue light, which stimulates the converter material 222 such that it emits yellow light. In other embodiments, the SST structure 220 can be configured to generate other colors of light in the visible spectrum (e.g., from about 390 nm to about 750 nm), in the infrared spectrum (e.g., from about 1,050 nm to about 1,550 nm), and/or in other suitable spectra.

As shown in FIG. 2A, the SST structure 220 can include an active region 224 between a first semiconductor material 226 and a second semiconductor material 228. The first semiconductor material 226 can include a P-type semiconductor material (e.g., a P-type gallium nitride ("P-GaN")), and the second semiconductor material 228 can include an N-type semiconductor (e.g., an N-type gallium nitride ("N-GaN")). In certain embodiments, the first and second semiconductor materials 226 and 228 can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials. The active region 224 can include a single quantum well ("SQW"), MQWs, and/or a bulk semiconductor material. The term "bulk semiconductor material" generally refers to a single grain semiconductor material (e.g., InGaN) with a thickness between approximately 10 nanometers and approximately 500 nanometers. In certain embodiments, the active region 224 can include an InGaN SQW, GaN/InGaN MQWs, and/or an InGaN bulk material. In other embodiments, the active region 224 can include aluminum gallium indium phosphide (AlGaInP), aluminum gallium indium nitride (AlGaInN), and/or other suitable materials or configurations.

The active region 224 and the first and second semiconductor materials 226 and 228 can be formed using metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques known in the semiconductor fabrication arts. In various embodiments, the SST structure 220 can be formed on a growth substrate and subsequently attached to a carrier substrate (not shown). In other embodiments, the SST structure 220 can remain on the growth substrate (e.g., a sapphire growth substrate) after formation.

As shown in FIG. 2A, the converter material 222 can be positioned forward of (e.g., over) the SST structure 220 such that the emissions from the SST structure 220 irradiate the converter material 222 to produce emissions having a different wavelength. In other embodiments, the converter material 222 can be positioned on other portions of the SST device 200 that are irradiated by the emissions from the SST structure 220. The irradiated converter material 222 can be configured to emit a light of a certain quality (e.g., color, warmth, intensity, etc.). For example, the irradiated converter material 222 can emit light having a different color (e.g., yellow light) than the light emitted by the SST structure 220 (e.g., blue light) or other first emitter 202a. The light emitted by the converter material 222 can combine with the light emitted by the SST structure 220 to produce a desired color of light (e.g., white light).

The converter material 222 can include a phosphor containing a doped yttrium aluminum garnet (YAG) (e.g., cerium (III)) at a particular concentration for emitting a range of colors (e.g., yellow to red) under photoluminescence. In other embodiments, the converter material 222 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium (IV)-doped YAG, dysprosium-doped YAG, samarium-doped YAG, terbium-doped YAG, and/or other suitable wavelength conversion materials. In further embodiments, the converter material 222 can include silicate phosphor, nitrate phosphor, aluminate phosphor and/or other types of salt or ester based phosphors. The converter material 222 can be formed using chemical vapor deposition ("CVD"), physical vapor deposition ("PVD"), atomic layer deposition ("ALD"), and/or other suitable formation techniques known in the semiconductor fabrication arts.

As shown in FIG. 2A, the converter material 222 and the SST structure 220 are separated by the selective wavelength reflector 206 such that the selective wavelength reflector 206 is positioned between two emitters that produce different wavelengths in different physical or spatial locations (e.g., the SST structure 220 at the active region 224 and the converter material 222 at or between its outer surfaces). In other embodiments, the selective wavelength reflector 206 can separate two other emitters (e.g., two converter materials or two SST structures). The selective wavelength reflector 206 can be made from a wide range of materials that reflect emissions from the forwardly-positioned second emitter 202b (e.g., the converter material 222) having a selected wavelength and transmit emissions from the underlying first emitter 202a (e.g., the SST structure 220) having a different wavelength. For example, the selective wavelength reflector 206 can include oxides (e.g., silicon dioxide ($SiO_2$) and titanium dioxide ($TiO_2$)), semiconductor materials, polymers, and/or other suitable selectively reflective and transmissive materials. The selective wavelength reflector 206 can also include one or more materials that enhance optical dispersion, such as fluoride glasses.

Figure 2B:
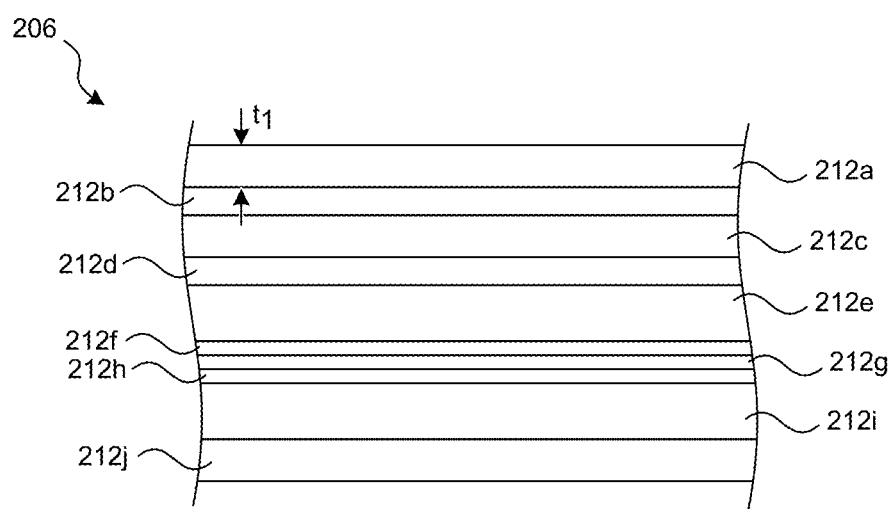
FIG. 2B is an enlarged cross-sectional view of a portion of a selective wavelength reflector configured in accordance with embodiments of the present technology.

In various embodiments, the selective wavelength reflector 206 can include two or more layers of materials with refractive indices and geometries that, when combined, at least substantially reflect a selected spectrum of wavelengths at all incident angles, while at least substantially limiting reflection of another spectrum of wavelengths. FIG. 2B, for example, is an enlarged cross-sectional view of the selective wavelength reflector 206 configured as a multilayer stack of materials 212 (identified individually as first through tenth materials 212a-j, respectively) in accordance with embodiments of the present technology. The materials 212 can be coated or otherwise formed on one another using CVD, PVD, ALD, and/or other suitable semiconductor fabrication methods known in the art.

In certain embodiments, the multilayer stack of the materials 212 can include silicon dioxide, titanium dioxide, and alloys thereof. For example, referring to FIG. 2B, the first, third, fifth and ninth materials 212a, 212c, 212e and 212i can be made from titanium dioxide, and the second, fourth, and sixth materials 212b, 212d, and 212f can be made from silicon dioxide. The seventh material 212g can include approximately 7% titanium dioxide, the eighth material 212h can include approximately 54% titanium dioxide, and the tenth material 212j can include approximately 51% titanium dioxide. As shown in FIG. 2B, each layer can have a generally uniform thickness (e.g., ti for the first material 212a) across its cross-sectional area, and the thicknesses of the various materials 212 can vary between layers. For example, the first through tenth materials 212a-j can have thicknesses of about 92 nm, 71 nm, 96 nm, 72 nm, 173 nm, 49 nm, 33 nm, 22 nm, 179 nm, and 110 nm, respectively.

Such a multilayer stack of materials 212 with the specified compositions and thicknesses can at least substantially reflect wavelengths between approximately 480 nm and approximately 750 nm (e.g., green, yellow, orange, and red light) at all incident angles and at least substantially transmit or otherwise substantially limit reflection of wavelengths between approximately 420 nm and approximately 480 nm (e.g., blue light). Accordingly, the multilayer selective wavelength reflector 206 can transmit blue light from, e.g., a blue light LED structure, and reflect incident yellow, orange, and red light from one or more overlying emitters (e.g., converter materials and/or SST structures). In other embodiments, the selective wavelength reflector 206 can include materials having other compositions and/or different thicknesses to selectively reflect certain wavelengths and transmit others. In further embodiments, the selective wavelength reflector 206 can include more or fewer layers of materials (e.g., 1 material, 3 materials, 15 materials, etc.), and/or the layers of the materials 212 can have other suitable geometries to transmit and reflect selected wavelengths.

In various embodiments, the first emitter 202a, the selective wavelength reflector 206, and the second emitter 202b can be formed sequentially on one another (e.g., on a carrier substrate) at a wafer or dice level. In other embodiments, portions of the SST device 200 can be formed separately and subsequently attached together. For example, the selective wavelength reflector 206 and the second emitter 202b (e.g., the converter material 222) can be formed together and attached to the first emitter 202a (e.g., the SST structure 220) as a unit using suitable attachment methods known in the semiconductor fabrication arts. In further embodiments, the first and second emitters 202a and 202b and the selective wavelength reflector 206 can be spaced apart from one another by additional layers of materials or structures (e.g., additional emitters).

Figure 1A:
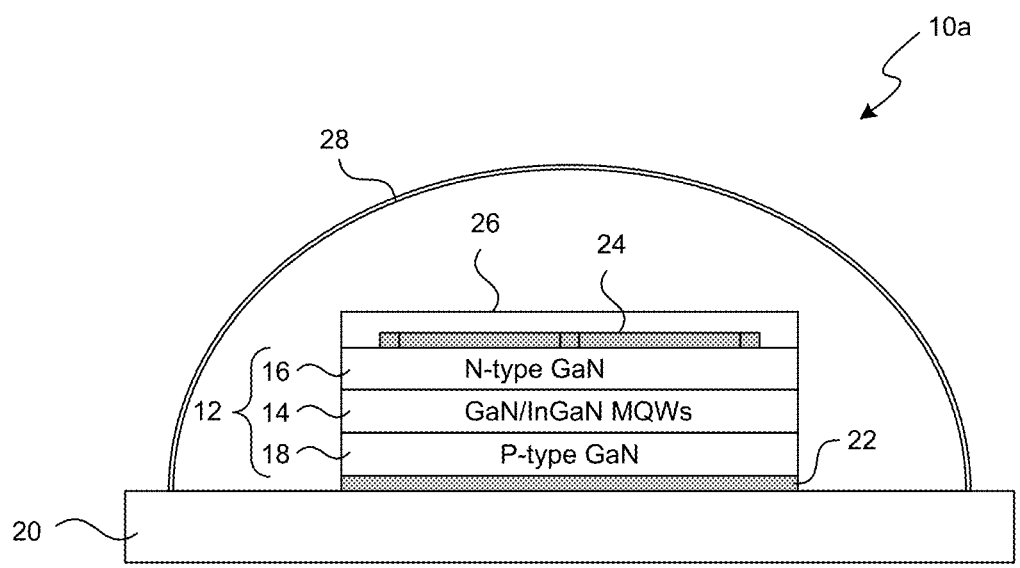
FIG. 1A is a partially schematic cross-sectional diagram of an SST device configured in accordance with the prior art.
Figure 1B:
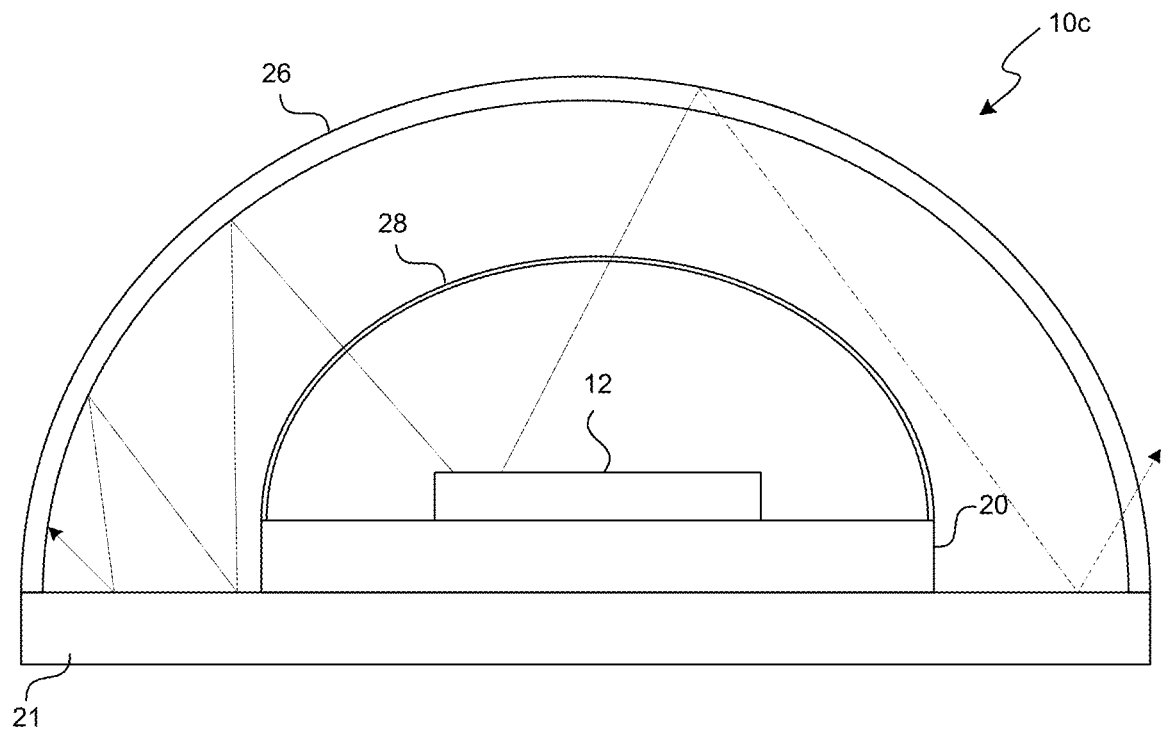
FIG. 1B is a partially schematic cross-sectional diagram of an SST device configured in accordance with another embodiment of the prior art.

Several embodiments of the SST device 200 shown in FIG. 2A can have enhanced light extraction efficiencies as compared to conventional SST devices. As explained above with reference to FIGS. 1A and 1B, conventional SST devices may be inefficient because, among other reasons, about half of the isotropic emissions of a converter material (e.g., phosphor) initially travel inward and reflect off of the face of the SST structure (often multiple times) before exiting the SST device, which dissipates the emissions and decreases the extraction efficiency of the SST device. The SST device 200 shown in FIG. 2A avoids the problems of conventional SST devices by spatially separating the SST structure 220 from the converter material 222 with the selective wavelength reflector 206, which inhibits the emissions from the converter material 222 reflecting off of the face of the SST structure 220. Instead, the selective wavelength reflector 206 forms a barrier that reflects or otherwise redirects a predefined wavelength of emissions toward the front side 204a of the SST device 200. The refractive index of the selective wavelength reflector 206 can be tuned for various different wavelengths depending upon the configuration of the emitters. In certain embodiments, for example, the selective wavelength reflector 206 can include one or more layers of materials that can enhance or maximize reflection within a relatively narrow range of wavelengths, such as those emitted by a narrow linewidth wavelength converter material. This selective and enhanced reflection reduces the reflections of the emissions and the resultant dissipation of the emissions, and therefore provides enhanced light extraction efficiency for the SST device 200.

Figure 3:
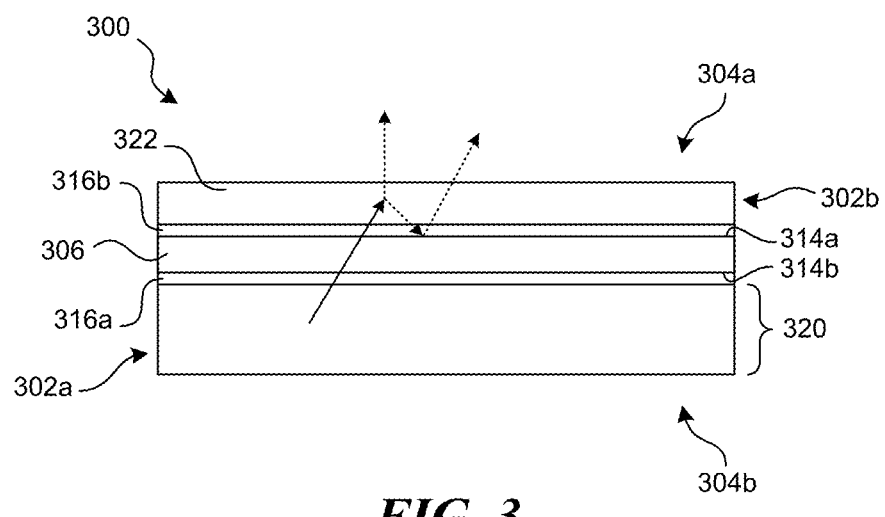
FIG. 3 is a cross-sectional view of an SST device configured in accordance with other embodiments of the present technology.

FIG. 3 is a cross-sectional view of an SST device 300 configured in accordance with other embodiments of the present technology. The SST device 300 can include features generally similar to the features of the SST device 200 described with reference to FIGS. 2A and 2B. For example, the SST device 300 can include a selective wavelength reflector 306 between two emitters 302 (identified individually as a first emitter 302a and a second emitter 302b). The first emitter 302a can be an SST structure 320 proximate a back surface 314b of the selective wavelength reflector 306, and the second emitter 302b can be a converter material 322 proximate a front surface 314a of the selective wavelength reflector 306.

As shown in FIG. 3, the SST device 300 can further include one or more spacers 316 (identified individually as a first spacer 316a and a second spacer 316b) separating the selective wavelength reflector 306 from the underlying SST structure 320 and/or the overlying converter material 322. The spacers 316 can be made from a transmissive material and formed on the SST structure 320, the selective wavelength reflector 306, the converter material 322, and/or other portions of the SST device 300 using CVD, PVD, and/or other suitable deposition techniques known in the art. In other embodiments, the spacers 316 can be made from one or more air gaps or voids at the front or back surfaces 314a and 314b of the selective wavelength reflector 306. The spacers 316 can be at least substantially transmissive to the wavelengths of the emissions from the first and second emitters 302a and 302b, and therefore do not interrupt the forward emissions of the first emitter 302a or the inwardly-directed emissions of the second emitter 302b that reflect off the selective wavelength reflector 306 before exiting the SST device 300 (e.g., as indicated by the arrows).

Figure 4:
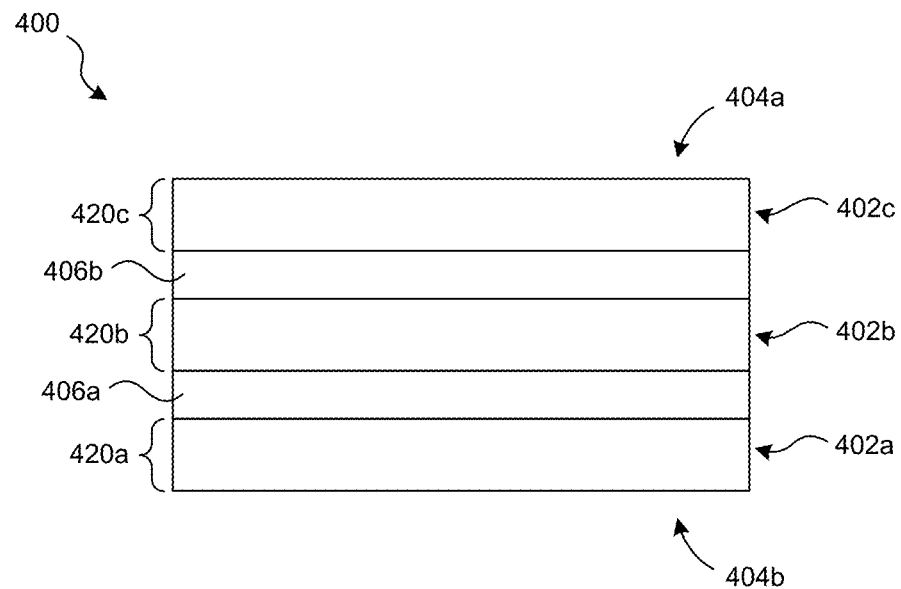
FIG. 4 is a cross-sectional view of an SST device configured in accordance with further embodiments of the present technology.

FIG. 4 is a cross-sectional view of an SST device 400 configured in accordance with further embodiments of the present technology. The SST device 400 includes features generally similar to the SST devices 200 and 300 described above with reference to FIGS. 2A-3. However, rather than a single selective wavelength reflector between two emitters, the SST device 400 illustrated in FIG. 4 includes three emitters 402 (identified as first through third emitters 402a-c, respectively) spaced apart from one another by intermediate selective wavelength reflectors 406 (identified as a first selective wavelength reflector 406a and a second selective wavelength reflector 406b). The first selective wavelength reflector 406a can be configured to transmit emissions from the first emitter 402a and reflect emissions from the second and third emitters 402b and 402c toward a front side 404a of the SST device 400. The second wavelength reflector 406b can be configured to transmit emissions from the first and second emitters 402a and 402b, but reflect emissions from the third emitter 402c toward the front side 404a.

As shown in FIG. 4, the emitters 402 can be a series of SST structures 420 (identified individually as first through third SST structures 420a-c, respectively) that each generate emissions having a different wavelength (e.g., a different color of light). The second and third SST structures 420b and 420c can be electrically driven, optically pumped, and/or otherwise configured to generate emissions (e.g., light). The SST structures 420 can be arranged such that emissions of individual SST structures 420 have an increasingly higher energy (i.e., shorter wavelengths) as they are positioned closer to a front side 404a of the SST device 400. In certain embodiments, for example, the SST device 400 can be configured as an RGB (red-green-blue) device in which the first SST structure 420a generates red light, the second SST structure 420b generates green light, and the third SST structure 420c generates blue light.

Each selective wavelength reflector 406 can then be configured to transmit the longer wavelength emissions of the SST structure(s) 420 positioned between a back side 404b of the SST device 400 and the individual selective wavelength reflector 406, and reflect the shorter wavelength emissions of the SST structures(s) 420 positioned forward of the individual selective wavelength reflector 406. In an RGB device, for example, the first selective wavelength reflector 406a is transmissive to red light (wavelength of about 620-750 nm) from the first SST structure 420a, and reflects the shorter wavelength green light (wavelength of about 495-570 nm) and blue light (wavelength of about 450-475 nm) produced by the second and third SST structures 420b and 420c. The second selective wavelength reflector 406b allows the longer wavelength red and green light from the first and second SST structures 420a and 420b to pass through it, and reflects the shorter wavelength blue light from the third SST structure 420c. Accordingly, the individual selective wavelength reflectors 406 can become transmissive to successively broader spectrums of wavelengths as they are positioned closer toward the front side 404a of the SST device 400 and reflect an increasingly narrower spectrum of shorter wavelength emissions from the overlying SST structures 420. In other embodiments, the emitters 402 can be a series of converter materials (e.g., driven by an underlying SST structure) arranged to emit light or other emissions having increasingly higher energies toward the front side 404a of the SST device 400.

Figure 5:
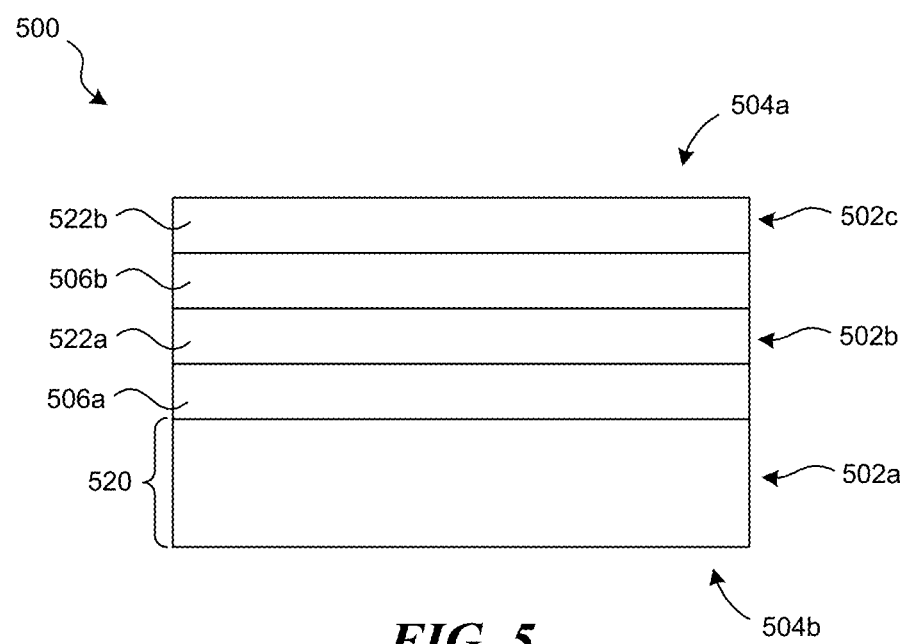
FIG. 5 is a cross-sectional view of an SST device configured in accordance with additional embodiments of the present technology.

FIG. 5 is a cross-sectional view of a portion of an SST device 500 configured in accordance with additional embodiments of the present technology. The SST device 500 includes features generally similar to the features of the SST device 400 described above with reference to FIG. 4, such as a plurality of emitters 502 (identified individually as first through third emitters 502a-c, respectively) and a plurality of selective wavelength reflectors 506 (identified individually as a first selective wavelength reflector 506a and a second selective wavelength reflector 506b) between adjacent emitters 502. However, in the embodiment illustrated in FIG. 5, the first emitter 502a is an SST structure 520, and the second and third emitters 502b and 502c are first and second converter materials 522a and 522b, respectively (referred to collectively as converter materials 522).

In certain embodiments, the first converter material 522a can produce emissions having a lower energy (e.g., longer wavelength) than the emissions of the second converter material 522b. This configuration allows the second selective wavelength reflector 506b to be configured to transmit the longer wavelength emissions of the first converter material 522a, as well as the emissions generated by the underlying SST structure 520, and reflect the shorter wavelength emissions of the second converter material 522b. For example, in various embodiments, the SST structure 520 can be configured to emit blue light, the first converter material 522a can be configured to emit red light, and the second converter material 522b can be configured to emit green light. The first selective wavelength reflector 506a can at least substantially transmit the blue light from the SST structure 520 and at least substantially reflect the red and green light from the converter materials 522, whereas the second selective reflector 506b can be configured to transmit the blue and red light from the SST structure 520 and the first converter material 522a and reflect the green light from the second converter material 522b. Accordingly, the SST device 500 can drive the light emitted by multiple emitters (e.g., both passive and active emitters) toward a front side 504a of the SST device 500 where it can be extracted to provide useful light.

Figure 6:
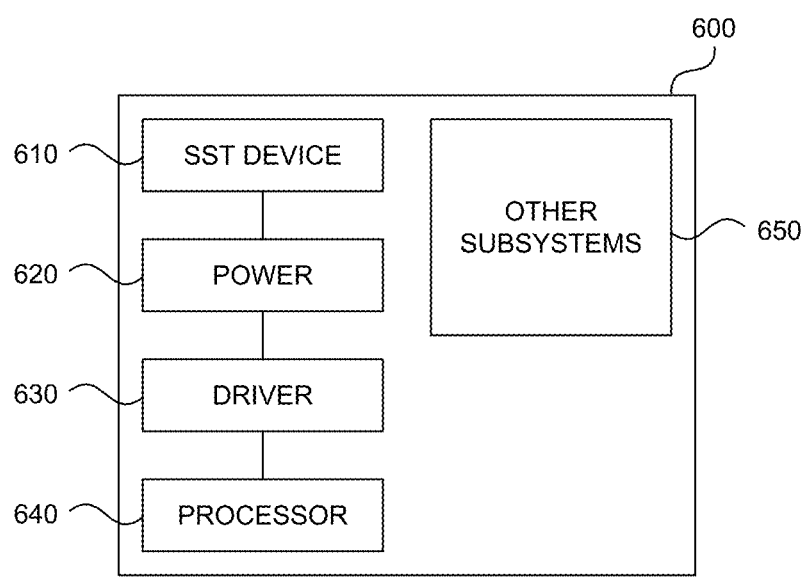
FIG. 6 is a schematic view of a system that includes an SST device in accordance with embodiments of the present technology.

Any one of the SST devices described above with reference to FIGS. 2A-5 can be incorporated into any of a myriad of larger and/or more complex systems, a representative example of which is system 600 shown schematically in FIG. 6. The system 600 can include an SST device 610, a power source 620, a driver 630, a processor 640, and/or other subsystems or components 650. The resulting system 600 can perform any of a wide variety of functions, such as backlighting, general illumination, power generations, sensors, and/or other suitable functions. Accordingly, representative systems 600 can include, without limitation, handheld devices (e.g., mobile phones, tablets, digital readers, and digital audio players), lasers, photovoltaic cells, remote controls, computers, and appliances. Components of the system 600 may be housed in a single unit or distributed over multiple, interconnected units (e.g., through a communications network). The components of the system 600 can also include local and/or remote memory storage devices, and any of a wide variety of computer readable media.

From the foregoing, it will be appreciated that specific embodiments of the technology have been described herein for purposes of illustration, but that various modifications may be made without deviating from the disclosure. For example, any of the SST devices described above with reference to FIGS. 2A-5 can include additional emitters (e.g., SST structures and/or converter materials), and optionally include additional selective wavelength reflectors spaced between adjacent emitters. In addition, the emitters and the selective wavelength reflectors shown in FIGS. 2A-5 have a generally uniform cross-sectional thickness. However, in other embodiments, one or more of the emitters and/or the selective wavelength reflector(s) may have non-uniform thicknesses. For example, the converter material 222 shown in FIG. 2A can have different thicknesses at selected areas to control the color of light it emits.

Certain aspects of the new technology described in the context of particular embodiments may be combined or eliminated in other embodiments. For example, the SST devices shown in FIGS. 2A, 4 and 5 can include one or more of the spacers 316 shown in FIG. 3 to separate the selective wavelength reflector(s) from adjacent emitters. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A solid-state transducer (SST) device, comprising:
a first emitter configured to emit first emission having a first wavelength;
a second emitter configured to emit second emission having a second wavelength different from the first wavelength; and
a selective wavelength reflector having a front surface facing a front side of the SST device from which the first and second emissions exit the SST device, and a back surface facing a back side of the SST device opposite to the front side, the first emitter being at the back surface and the second emitter being at the front surface, wherein:
the selective wavelength reflector is configured to at least substantially transmit the first emission and at least substantially reflect the second emission; and
the selective wavelength reflector includes a multilayer stack of materials comprising layers of silicon dioxide ($SiO_2$), titanium dioxide ($TiO_2$), and alloys thereof, two $TiO_2$ layers of the multilayer stack being separated by a $SiO_2$ layer and at least one alloy layer,
wherein the first emitter includes an SST structure having a first semiconductor material comprising N-type gallium nitride (N-GaN), a second semiconductor material comprising a P-type gallium nitride (P-GaN), and an active region comprising indium gallium nitride (InGaN), the active region being between the first and second semiconductor materials;
wherein the SST structure is configured to emit blue light;
wherein the second emitter includes a converter material configured to emit yellow light; and
wherein the selective wavelength reflector is configured to at least substantially transmit the blue light and at least substantially reflect the yellow light.

2. A solid-state transducer (SST) device, comprising:
a first emitter configured to emit first emission having a first wavelength;
a second emitter configured to emit second emission having a second wavelength different from the first wavelength; and
a selective wavelength reflector having a front surface facing a front side of the SST device from which the first and second emissions exit the SST device, and a back surface facing a back side of the SST device opposite to the front side, the first emitter being at the back surface and the second emitter being at the front surface, wherein:
the selective wavelength reflector is configured to at least substantially transmit the first emission and at least substantially reflect the second emission; and
the selective wavelength reflector includes a multilayer stack of materials comprising layers of silicon dioxide ($SiO_2$), titanium dioxide ($TiO_2$), and alloys thereof, two $TiO_2$ layers of the multilayer stack being separated by a $SiO_2$ layer and at least one alloy layer,
wherein the first emitter is an SST structure configured to emit blue light;
wherein the second emitter is a first converter material configured to emit red light;
wherein the selective wavelength reflector is a first selective wavelength reflector configured to at least substantially transmit the blue light and at least substantially reflect the red light and green light toward the front side of the SST device; and
wherein the SST device further comprises:
a second converter material proximate the front side of the SST device with respect to the first converter material, the second converter material being configured to emit the green light; and
a second selective wavelength reflector between the first and second converter materials, wherein the second selective wavelength reflector is configured to at least substantially transmit the blue and red light and at least substantially reflect the green light toward the front side of the SST device.

3. The SST device of claim 1, wherein:
the first emission has a first energy; and
the second emission has a second energy less than the first energy.

4. The SST device of claim 1, wherein the first wavelength is shorter than the second wavelength.

5. The SST device of claim 1, wherein each material of the multilayer stack of materials has a thickness and a refractive index such that a combination of the materials in the multilayer stack at least substantially transmits the first emission and at least substantially reflects the second emission toward the front side of the SST device.

6. The SST device of claim 1, wherein the multilayer stack of materials of the selective wavelength reflector further comprises fluoride glasses.

7. The SST device of claim 1, further comprising:
a spacer separating the selective wavelength reflector from the first emitter or from the second emitter, wherein the spacer includes a substantially transmissive nonconductive material to the first and second emissions.

8. The SST device of claim 7, wherein:
the first emitter includes an active region having a first dimension, across which the first emission is emitted; and
the spacer includes a second dimension that is substantially parallel to and same as the first dimension.

9. The SST device of claim 1, wherein the at least one alloy layer comprises an alloy layer including approximately 7% titanium dioxide.

10. The SST device of claim 1, wherein the at least one alloy layer comprises an alloy layer including approximately 54% titanium dioxide.

11. A solid-state transducer (SST) device, comprising:
an SST structure configured to emit first emission having a first wavelength;

a converter material structure configured to emit second emission having a second wavelength different from the first wavelength; and a selective wavelength reflector between the SST structure and the converter material structure, wherein:
the selective wavelength reflector has a refractive index configured to at least substantially reflect the second emission and at least substantially limit reflection of the first emission; and
the selective wavelength reflector includes a multilayer stack of materials comprising layers of silicon dioxide ($SiO_2$), titanium dioxide ($TiO_2$), and alloys thereof, two $TiO_2$ layers of the multilayer stack being separated by a $SiO_2$ layer and at least one alloy layer,
wherein the SST device has a front side from which the first and second emissions exit the SST device and a back side facing away from the front side;
the converter material structure comprises a plurality of converter materials proximate the front side of the SST device with respect to the SST structure, the converter materials of the plurality being configured to emit emission with successively shorter wavelengths as the converter materials of the plurality are positioned closer to the front side of the SST device;
the selective wavelength reflector is a first selective wavelength reflector; and
the SST device further comprises:
a plurality of second selective wavelength reflectors between adjacent converter materials of the plurality, each second selective wavelength reflector having a second refractive index configured to at least substantially reflect emission of the overlying converter material(s) and at least substantially limit reflection of emission of the underlying converter material(s).

12. The SST device of claim 11, wherein:
the first wavelength ranges from about 420 nm to about 480 nm; and
the second wavelength ranges from about 480 nm to about 750 nm.

13. The SST device of claim 11, further comprising:
a spacer separating the selective wavelength reflector from the SST structure or from the converter material structure, wherein the spacer is configured to be substantially transmissive to the first and second emissions.

14. A light emitting diode (LED) device, comprising:
an LED structure configured to emit first light having a first wavelength;
an emitter configured to emit second light having a second wavelength different from the first wavelength; and
a selective wavelength reflector having a front surface facing a front side of the LED device from which the first and second light exit the LED device, and a back surface facing a back side of the LED device opposite to the front side, the LED structure being at the back surface and the emitter being at the front surface, wherein:
the selective wavelength reflector is configured to at least substantially transmit the first light and at least substantially reflect the second light; and
the selective wavelength reflector includes a multilayer stack of materials comprising layers of silicon dioxide ($SiO_2$), titanium dioxide ($TiO_2$), and alloys thereof, two $TiO_2$ layers of the multilayer stack being separated by a $SiO_2$ layer and at least one alloy layer,
wherein the emitter comprises a plurality of converter materials proximate the front side of the LED device with respect to the LED structure, the converter materials of the plurality being configured to emit light having successively shorter wavelengths as the converter materials of the plurality are positioned closer to the front side of the LED device;
wherein the selective wavelength reflector is a first selective wavelength reflector; and
wherein the LED device further comprises a plurality of second selective wavelength reflectors between adjacent converter materials of the plurality, each second selective wavelength reflector having a refractive index configured to at least substantially reflect light emitted by the overlying converter material(s) and at least substantially limit reflection of light emitted by the underlying converter material(s).

15. The LED device of claim 14, wherein:
the LED structure is configured to emit blue light;
the emitter includes a converter material configured to emit yellow light; and
the selective wavelength reflector is configured to at least substantially transmit the blue light and at least substantially reflect the yellow light.

16. A light emitting diode (LED) device, comprising:
an LED structure configured to emit first light having a first wavelength;
an emitter configured to emit second light having a second wavelength different from the first wavelength; and
a selective wavelength reflector having a front surface facing a front side of the LED device from which the first and second light exit the LED device, and a back surface facing a back side of the LED device opposite to the front side, the LED structure being at the back surface and the emitter being at the front surface, wherein:
the selective wavelength reflector is configured to at least substantially transmit the first light and at least substantially reflect the second light; and
the selective wavelength reflector includes a multilayer stack of materials comprising layers of silicon dioxide ($SiO_2$), titanium dioxide ($TiO_2$), and alloys thereof, two $TiO_2$ layers of the multilayer stack being separated by a $SiO_2$ layer and at least one alloy layer,
wherein the LED structure is configured to emit blue light;
wherein the emitter is a first converter material configured to emit red light;
wherein the selective wavelength reflector is a first selective wavelength reflector configured to at least substantially transmit the blue light and at least substantially reflect the red light and green light toward the front side of the LED device; and
wherein the LED device further comprises:
a second converter material proximate the front side of the LED device with respect to the first converter material, the second converter material being configured to emit the green light; and
a second selective wavelength reflector between the first and second converter materials, wherein the second selective wavelength reflector is configured to at least substantially transmit the blue and red light and at least substantially reflect the green light toward the front side of the LED device.

17. The LED device of claim 14, wherein each material of the multilayer stack of materials has a thickness and a refractive index such that a combination of the materials in the multilayer stack at least substantially transmits the first light and at least substantially reflects the second light toward the front side of the LED device.

\* \* \* \* \*